(12) United States Patent
Worledge et al.

(10) Patent No.: US 7,081,658 B2
(45) Date of Patent: Jul. 25, 2006

(54) TECHNIQUES FOR REDUCING NEEL COUPLING IN TOGGLE SWITCHING SEMICONDUCTOR DEVICES

(75) Inventors: Daniel Christopher Worledge, Poughquag, NY (US); Ulrich Klostermann, Fontainebleau (FR)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 10/878,156

(22) Filed: Jun. 28, 2004

(65) Prior Publication Data

US 2005/0285168 A1    Dec. 29, 2005

(51) Int. Cl.
*H01L 29/82* (2006.01)

(52) U.S. Cl. .............................. 257/421; 257/E27.006; 257/295

(58) Field of Classification Search ................ 257/421
See application file for complete search history.

(56) References Cited

U.S. PATENT DOCUMENTS 6,885,073 B1 *   4/2005   Drewes ...................... 257/421
2003/0168673 A1 *   9/2003   Yuasa et al. ................ 257/200

* cited by examiner

*Primary Examiner*—Tu-Tu Ho
(74) *Attorney, Agent, or Firm*—Ryan, Mason & Lewis, LLP

(57) ABSTRACT

The present invention provides techniques for data storage. In one aspect of the invention, a semiconductor device is provided. The semiconductor device comprises at least one free layer and at least one fixed layer, with at least one barrier layer therebetween. At least one pinned magnetic layer is separated from the at least one free layer by at least one non-magnetic layer, the at least one pinned magnetic layer and non-magnetic layer being configured to cancel out at least a portion of a Neel coupling between the at least one free layer and the at least one fixed layer.

21 Claims, 3 Drawing Sheets

US 7,081,658 B2

TECHNIQUES FOR REDUCING NEEL COUPLING IN TOGGLE SWITCHING SEMICONDUCTOR DEVICES

STATEMENT OF GOVERNMENT RIGHTS

This invention was made with Government support under grant contract number MDA972-99-C-0009 awarded by the Defense Advanced Research Projects Agency (DARPA) of the United States Department of Defense. The Government has certain rights in this invention.

FIELD OF THE INVENTION

The present invention relates to semiconductor devices and, more particularly, to semiconductor devices for data storage.

BACKGROUND OF THE INVENTION

Certain semiconductor devices, e.g., magnetic random access memory (MRAM) devices, use magnetic memory cells to store information. Each magnetic memory cell typically comprises a submicron piece of magnetic material, e.g., having the dimensions of 300 nanometers (nm) by 600 nm in area and five nm thick.

Information is stored in such semiconductor devices as an orientation of the magnetization of a free layer in the magnetic memory cell as compared to an orientation of the magnetization of a fixed (e.g., reference) layer in the memory cell. The magnetization of the free layer may be oriented parallel or anti-parallel relative to the fixed layer, representing either a logic "1" or a "0." The orientation of the magnetization of a given layer (fixed or free) may be represented by an arrow pointing either to the left or to the right. When the magnetic memory cell is sitting in a zero applied magnetic field, the magnetization of the magnetic memory cell is stable, pointing either left or right. The application of a magnetic field can switch the magnetization of the free layer from left to right, and vice versa, to write information to the magnetic memory cell.

A particular type of magnetic memory cell, a "toggle" magnetic memory cell, employs a free layer comprising two magnetic layers separated by a non-magnetic spacer layer. This multi-layer free layer is typically separated from a fixed layer of the magnetic memory cell by a tunnel barrier, such that one of the multiple layers making up the free layer is adjacent to the tunnel barrier. It is this layer adjacent to the tunnel barrier that primarily determines a resistance of the tunnel junction, which relates to the information stored.

The fixed layer typically comprises one or more pinned layers. The one or more pinned layers can be formed from a single magnetic layer (e.g., a simple pinned layer), or alternatively, from two magnetic layers tightly anti-parallel coupled by a non-magnetic spacer layer (e.g., an anti-parallel (AP) pinned layer). The one or more pinned layers, either simple or AP, have a fixed direction of magnetization corresponding to an anti-ferromagnetic layer to which the one or more pinned layers are pinned.

With these typical toggle magnetic memory cell configurations, however, Neel coupling often causes the one or more pinned layers to disturb the operation of the free layer. Neel coupling, also referred to as "orange peel" coupling, arises from the formation of magnetic poles on the rough magnetic interfaces of the magnetic layers, e.g., between the one or more pinned layers, the free layer and the barrier layer.

The magnetic poles formed induce the directions of magnetization of the magnetic layers on either side of the barrier to line up parallel to each other. One way to reduce Neel coupling is to reduce surface interface roughness of the layers. Reducing the roughness of the layers, however, is difficult under typical manufacturing conditions, and in practice, some residual roughness always remains. Therefore, some amount of Neel coupling is always present.

Neel coupling disadvantageously reduces the write margins of the semiconductor device. Therefore, it would be desirable to reduce, or eliminate, the effects of Neel coupling on the switching of toggle magnetic memory cells.

SUMMARY OF THE INVENTION

The present invention provides techniques for data storage. In one aspect of the invention, a semiconductor device is provided. The semiconductor device comprises at least one free layer and at least one fixed layer, with at least one barrier layer therebetween. At least one pinned magnetic layer is separated from the at least one free layer by at least one non-magnetic layer, the at least one pinned magnetic layer and non-magnetic layer being configured to cancel out at least a portion of a Neel coupling between the at least one free layer and the at least one fixed layer.

A more complete understanding of the present invention, as well as further features and advantages of the present invention, will be obtained by reference to the following detailed description and drawings.

DETAILED DESCRIPTION OF THE INVENTION

Figure 1:
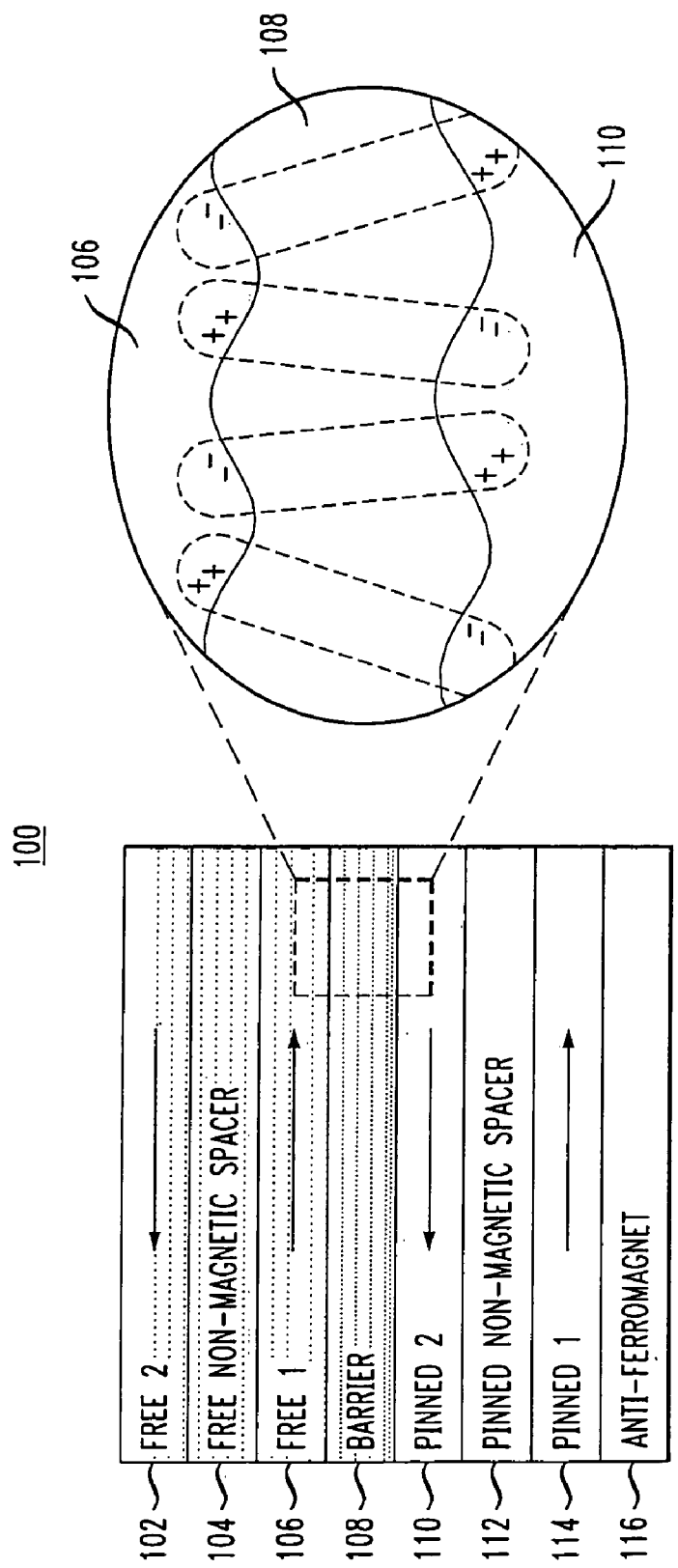
FIG. 1 is a diagram illustrating a toggle magnetic memory cell.

FIG. 1 is a diagram illustrating a toggle magnetic memory cell. As used herein, the term "toggle magnetic memory cell" refers to magnetic memory cells having a free layer comprising multiple magnetic layers. In FIG. 1 toggle magnetic memory cell 100 comprises free magnetic layers 102 and 106, labeled "free 2" and "free 1," respectively, separated by non-magnetic spacer layer 104, labeled "free non-magnetic spacer." Toggle magnetic memory cell 100 also comprises barrier layer 108, labeled "barrier." As will be described in detail below, barrier layer 108 separates a free layer from a fixed layer of toggle magnetic memory cell 100. Below barrier layer 108, are pinned magnetic layers 110 and 114, labeled "pinned 2" and "pinned 1," respectively, anti-parallel coupled by non-magnetic spacer layer 112, labeled "pinned non-magnetic spacer." Each of pinned magnetic layers 110 and 114, being anti-parallel coupled to each other, are thus each also pinned to anti-ferromagnetic layer 116, labeled "anti-ferromagnet."

Free magnetic layers 102 and 106 with non-magnetic spacer layer 104 therebetween, form a free layer of toggle magnetic memory cell 100. Pinned magnetic layers 110 and 114, and non-magnetic spacer layer 112 therebetween, as well as, associated anti-ferromagnetic layer 116 form a fixed layer of toggle magnetic memory cell 100. The free layer and the fixed layer of toggle magnetic memory cell 100 are thus separated by barrier layer 108.

Although the layers in FIG. 1, for simplicity, are shown to have smooth surfaces, typical manufacturing and fabrication processes result in the layers having a rough surface similar to that found on the surface of an orange peel. This interface roughness that exists, e.g., between free magnetic layer 106 and barrier layer 108, and between barrier layer 108 and pinned magnetic layer 110, results in Neel coupling of the free and fixed layers, such that the fixed layer disturbs the operation of the free layer. Namely, due to the striations on the surfaces of these layers, small magnetic poles form, as shown in the magnified view of the interface between free magnetic layer 106, barrier layer 108 and pinned magnetic layer 110. These poles attract each other causing coupling of, e.g., free magnetic layer 106 and pinned magnetic layer 110. As will be described in detail below, this coupling affects the switching properties of the free layer.

Figure 2:
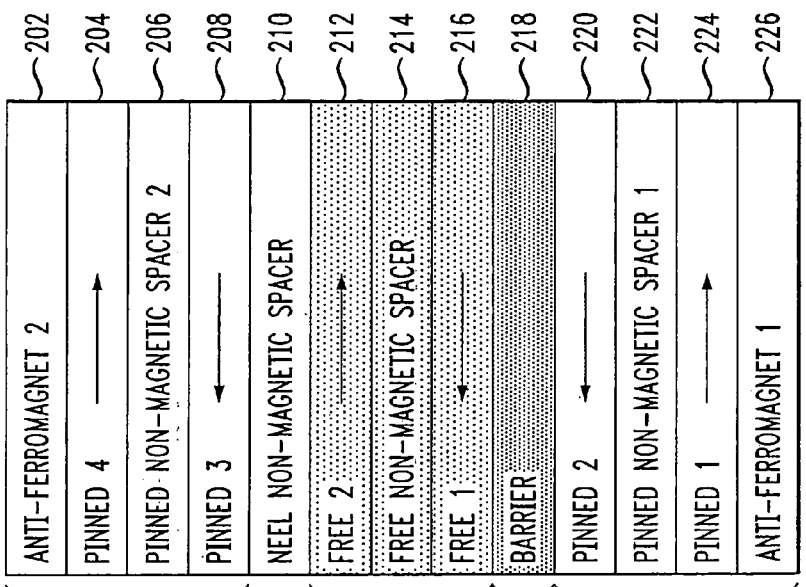
FIG. 2 is a diagram illustrating an exemplary toggle magnetic memory cell in a "1" state configuration having an anti-parallel (AP) pinned layer to counteract Neel coupling effects according to an embodiment of the present invention.

According to the techniques of the invention presented herein, the effects of Neel coupling in toggle magnetic memory cells may be reduced or eliminated by employing an anti-parallel (AP) pinned layer associated with a free layer of a toggle magnetic memory cell. FIG. 2 is a diagram illustrating an exemplary toggle magnetic memory cell in a '1' state configuration having an AP pinned layer to counteract Neel coupling effects.

In FIG. 2, toggle magnetic memory cell 200 comprises anti-ferromagnetic layer 202 (labeled "anti-ferromagnet 2") for pinning the direction of magnetization of pinned layers 204 and 208, labeled "pinned 4" and "pinned 3," respectively, tightly anti-parallel coupled by non-magnetic spacer layer 206 (labeled "pinned non-magnetic spacer 2") therebetween, e.g., having a coupling field strength greater than, for example, the applied field and the saturation field.

Adjacent to pinned layer 208 is non-magnetic spacer layer 210 (labeled "Neel non-magnetic spacer"). Adjacent to non-magnetic spacer layer 210, opposite pinned layer 208, is free layer 212 (labeled "free 2") separated from free layer 216 (labeled "free 1") by non-magnetic spacer layer 214 (labeled "free non-magnetic spacer").

Adjacent to free layer 216 is barrier layer 218 (labeled "barrier"). Adjacent to barrier layer 218, opposite free layer 216, is pinned layer 220 (labeled "pinned 2") tightly antiparallel coupled to pinned layer 224 (labeled "pinned 1") by non-magnetic spacer layer 222 (labeled "pinned non-magnetic spacer 1"). Adjacent to pinned layer 224, opposite non-magnetic spacer layer 222, is anti-ferromagnetic layer 226 (labeled "anti-ferromagnet 1").

According to an exemplary embodiment of the present invention, pinned layers 220 and 224 and non-magnetic spacer layer 222 therebetween, as well as anti-ferromagnetic layer 226 associated therewith form a fixed layer of toggle magnetic memory cell 200. Free layers 212 and 216 and non-magnetic spacer layer 214 therebetween form a free layer of toggle magnetic memory cell 200. Pinned layers 204 and 208 and non-magnetic spacer layer 206 therebetween, as well as anti-ferromagnetic layer 202 associated therewith, form a Neel coupling counteractive layer of toggle magnetic memory cell 200. Each of the fixed layer, free layer and Neel coupling counteractive layer, are not limited to a particular number or configuration of respective layers.

The Neel coupling counteractive layer and the free layer are separated by non-magnetic spacer layer 210. The free layer and the fixed layer are separated by barrier layer 218.

Anti-ferromagnetic layer 202 and anti-ferromagnetic layer 226 each may comprise a metal alloy, including, but not limited to, platinum/manganese alloys (PtMn), iridium/manganese alloys (IrMn) and combinations comprising at least one of the foregoing alloys. Anti-ferromagnetic layer 202 and anti-ferromagnetic layer 226 may have the same, or different, compositions. In an exemplary embodiment, anti-ferromagnetic layer 202 and anti-ferromagnetic layer 226 have the same composition.

Pinned layers 204 and 208 each may comprise a ferromagnetic material. Suitable ferromagnetic materials include, but are not limited to, cobalt/iron alloys (CoFe). Pinned layers 204 and 208 may have the same, or different, compositions. In an exemplary embodiment, pinned layers 204 and 208 have the same composition.

Non-magnetic spacer layer 206 may comprise a non-magnetic material. Suitable non-magnetic materials include, but are not limited to, ruthenium (Ru).

Non-magnetic spacer layer 210 may comprise any non-magnetic material that adds little, if any, resistance to the toggle magnetic memory cell structure, or a tunnel barrier material where the tunnel magnetoresistance between pinned layer 208 and free layer 212 is inverse magnetoresistance. Suitable non-magnetic materials include, for example, non-magnetic metallic materials, including, but not limited to, tantalum (Ta), tantalum nitride (TaN) and combinations comprising at least one of the foregoing non-magnetic metallic materials. Further, as will be described in detail below, the thickness of non-magnetic spacer layer 210 may be chosen so as to counteract at least a portion of the Neel coupling experienced between the free layer and the fixed layer of the device.

Free layers 212 and 216 may comprise any suitable material, including, but not limited to, nickel/iron alloys (NiFe), cobalt/iron/boron alloys (CoFeB) and combinations comprising at least one of the foregoing alloys. Free layers 212 and 216 may have the same, or different, compositions. In an exemplary embodiment, free layers 212 and 216 have the same composition.

Non-magnetic spacer layer 214 may comprise a non-magnetic material including, but not limited to, Ru. Barrier layer 218 may comprise, for example, aluminum (Al) oxides of the general formula, $AlO_x$, including, but not limited to, $Al_2O_3$. Alternative materials may also be employed (e.g., tantalum (Ta) oxides of the general formula, $TaO_x$ and magnesium (Mg) oxides of the general formula, $MgO_x$).

As with pinned layers 204 and 208, each of pinned layers 220 and 224 may comprise a ferromagnetic material including, but not limited to, CoFe, and may have the same, or different, compositions. In an exemplary embodiment, pinned layers 220 and 224 have the same composition. Further, as with non-magnetic spacer layer 206, non-magnetic spacer layer 222 may comprise a non-magnetic material, including, but not limited to Ru.

As shown in FIG. 2, when toggle magnetic memory cell 200 is in a particular state, e.g., a "1" state, free layer 216 has a direction of magnetization opposite to the direction of magnetization of pinned layer 220. As described above, for example, in conjunction with the description of FIG. 1, Neel coupling between free layer 216 and pinned layer 220 can result in the direction of magnetization of free layer 216 being influenced by, and lining up parallel to, the direction of magnetization of pinned layer 220.

The Neel coupling counteractive layer, however, counteracts at least a portion of the Neel coupling between free layer 216 and pinned layer 220. Specifically, anti-ferromagnetic layer 202 pins (i.e., fixes) the direction of magnetization of pinned layer 204. Since pinned layer 204 is anti-parallel coupled to pinned layer 208, e.g., by non-magnetic spacer layer 206, its direction of magnetization will remain opposite to that of pinned layer 208.

Similar to free layer 216 and pinned layer 220, surface interface roughness between free layer 212 and non-magnetic spacer layer 210, and between non-magnetic spacer layer 210 and pinned layer 208 results in Neel coupling of free layer 212 and pinned layer 208. Since, as was mentioned above, free layers 212 and 216 are anti-parallel coupled to one another, e.g., by non-magnetic spacer layer 214, and thus will have directions of magnetization that will remain opposite to each other, the Neel coupling between pinned layer 208 and free layer 212 can counteract at least a portion of the effects of the Neel coupling between free layer 216 and pinned layer 220.

According to this exemplary embodiment, pinned layer 208 should have a direction of magnetization the same as the direction of magnetization of pinned layer 220. Obtaining this particular direction of magnetization for pinned layer 208 is easy since, as mentioned above, pinned layer 208 is anti-parallel coupled to pinned layer 204, pinned layer 204 having a direction of magnetization set by anti-ferromagnetic layer 202.

Further, as was mentioned above, the thickness of non-magnetic spacer layer 210 may be chosen to increase or decrease an intensity of the Neel coupling between pinned layer 208 and free layer 212 as desired, so as to achieve a proper counterbalancing of the Neel coupling between free layer 216 and pinned layer 220. Namely, a thicker non-magnetic spacer layer 210 will result in less Neel coupling between pinned layer 208 and free layer 212, while a thinner non-magnetic spacer layer 210 will result in greater Neel coupling between pinned layer 208 and free layer 212. In an exemplary embodiment of the present invention, non-magnetic spacer layer 210 has a thickness that is substantially similar to the thickness of barrier layer 218, e.g., ±5 angstroms (Å), such that the amount of Neel coupling experienced between pinned layer 208 and free layer 212 is substantially similar to, e.g., the same as, that experienced between free layer 216 and pinned layer 220, thus reducing or eliminating the net effective Neel coupling (e.g., zero net Neel coupling). In this exemplary embodiment, barrier layer 218 has a thickness of, e.g., from about ten Å to about 15 Å.

Figure 3:
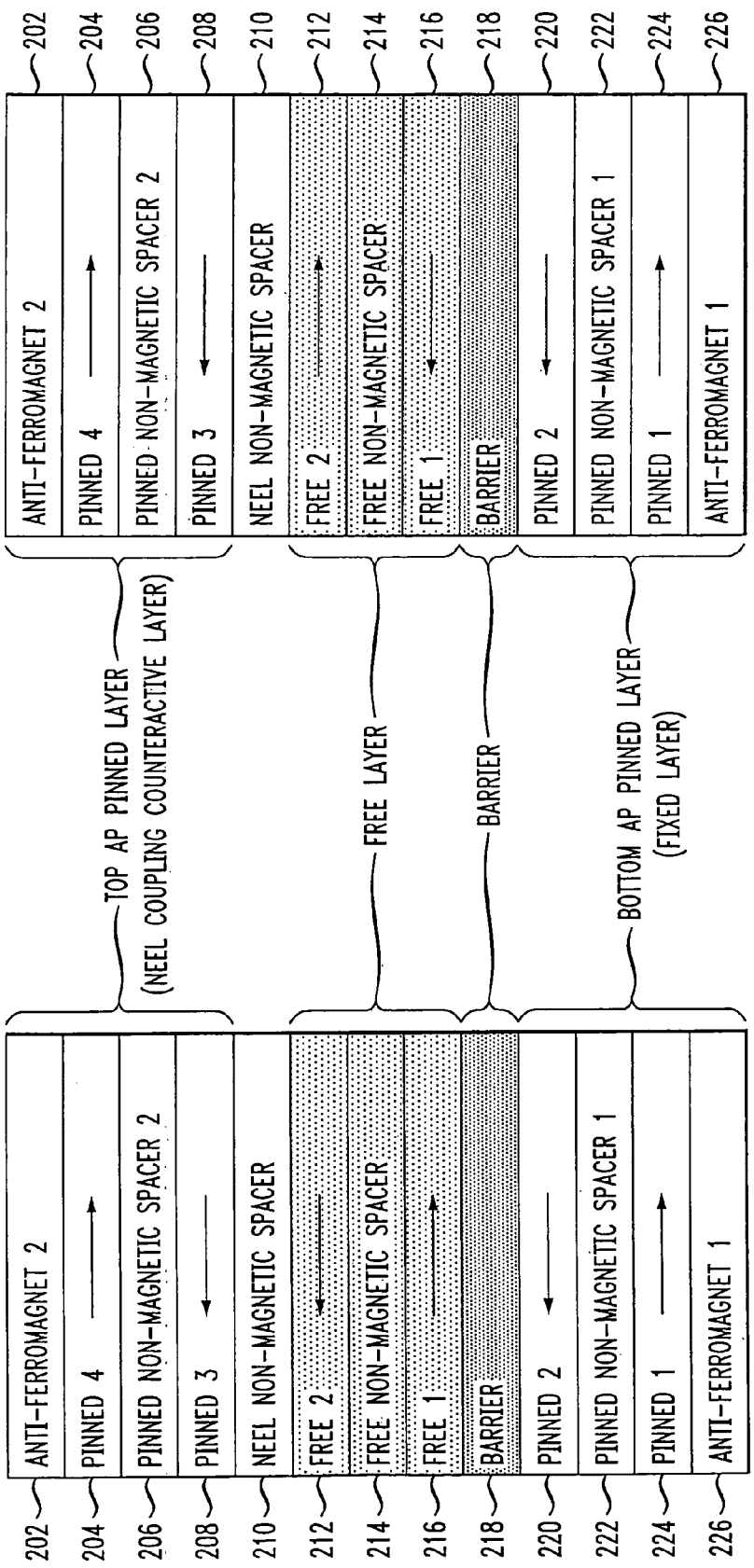
FIG. 3 is a diagram illustrating an exemplary toggle magnetic memory cell in a "0" state configuration having an AP pinned layer to counteract Neel coupling effects according to an embodiment of the present invention.

FIG. 3 is a diagram illustrating the exemplary toggle magnetic memory cell 200 shown in FIG. 2 in a "0" state configuration having an AP pinned layer to counteract Neel coupling effects. In FIG. 3, toggle magnetic memory cell 200 has the same composition and configuration of layers as that shown illustrated in FIG. 2. The directions of magnetization of free layers 212 and 216 are, however, both opposite to those shown in FIG. 2 (as well as being opposite to each other).

The effects of the Neel coupling counteractive layer are the same as described above in conjunction with the description of FIG. 2. Namely, while the direction of magnetization of free layer 216 is now parallel to the direction of magnetization of pinned layer 220, the direction of magnetization of free layer 212 (anti-parallel coupled to free layer 216) is now anti-parallel to pinned layer 208. Therefore, the effects of Neel coupling between free layer 216 and pinned layer 220 are sufficiently counteracted in both the exemplary "1" state, as in FIG. 2, and the exemplary "0" state, as in FIG. 3.

Figure 4:
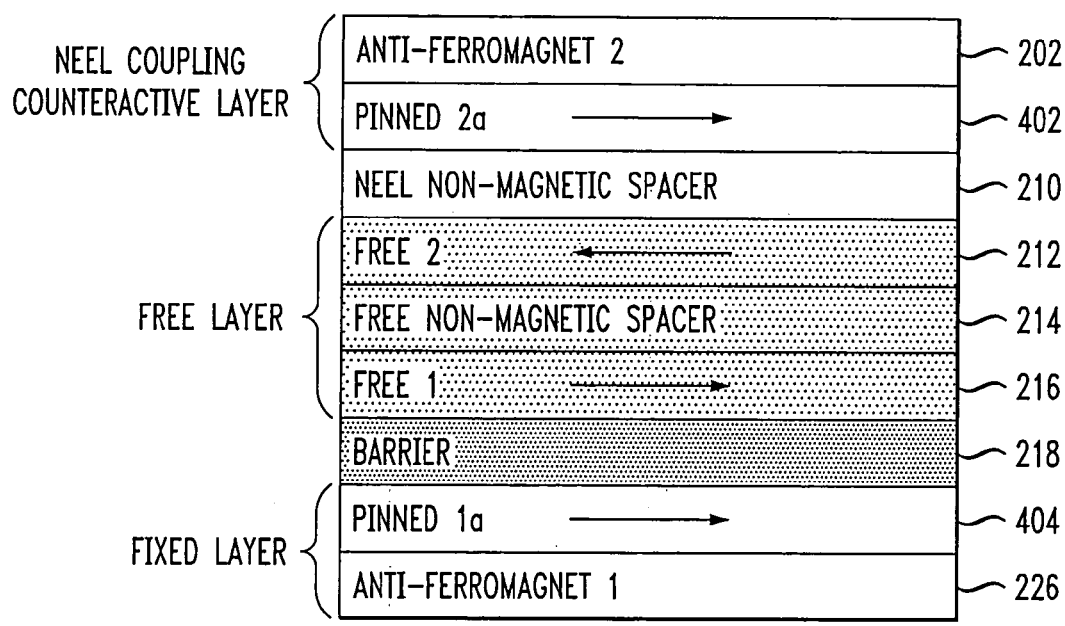
FIG. 4 is a graph illustrating an exemplary toggle magnetic memory cell having a single pinned layer to counteract Neel coupling effects according to an embodiment of the present invention.

In another exemplary embodiment of the present invention, the Neel coupling counteractive layer and the fixed layer comprise a single pinned layer, as shown, for example, in FIG. 4. Employing single pinned layers allows for the production of an easy axis offset in the free layer. In FIG. 4, toggle magnetic memory cell 400 comprises pinned layer 402 (labeled "pinned 2a") pinned to anti-ferromagnetic layer 202. Adjacent to pinned layer 402 opposite anti-ferromagnet layer 202 is non-magnetic spacer layer 210. Adjacent to non-magnetic spacer layer 210 opposite pinned layer 402 is free layer 212 anti-parallel coupled to free layer 216 by non-magnetic spacer layer 214. Adjacent to free layer 216 opposite non-magnetic spacer layer 214 is barrier layer 218. Adjacent to barrier layer 218 opposite free layer 216 is pinned layer 404 (labeled "pinned 1a") pinned to anti-ferromagnetic layer 226.

Like pinned layers 204, 208, 220 and 224 of toggle magnetic memory cell 200 shown in FIG. 2 and FIG. 3, pinned layers 402 and 404 may comprise a ferromagnetic material including, but not limited to, CoFe, and may have the same, or different, compositions. In an exemplary embodiment, pinned layers 402 and 404 have the same composition.

In the exemplary configuration shown illustrated in FIG. 4, anti-ferromagnetic layer 202 and pinned layer 402 form a Neel coupling counteractive layer of toggle magnetic memory cell 400. Free layers 212 and 216 and non-magnetic spacer layer 214 therebetween form a free layer of toggle magnetic memory cell 400. Pinned layer 404 and anti-ferromagnetic layer 226 form a fixed layer of toggle magnetic memory cell 400.

In the exemplary toggle magnetic memory cell configuration shown in FIG. 4, Neel coupling would be present between free layer 216 and pinned layer 404 due to surface interface roughness between free layer 216 and barrier layer 218, and between barrier layer 218 and pinned layer 404. However, at least a portion of this Neel coupling effect can be counteracted by the Neel coupling that is present between pinned layer 402 and free layer 212. Namely, as was described above in conjunction with the description of FIG. 2, surface interface roughness between pinned layer 402 and non-magnetic spacer layer 210, and between non-magnetic spacer layer 210 and free layer 212 results in Neel coupling between pinned layer 402 and free layer 212.

Further, as was described above, non-magnetic spacer layer 210 can be chosen to have a thickness such that the resulting Neel coupling between pinned layer 402 and free layer 212 will counteract at least a portion of the Neel coupling present between free layer 216 and pinned layer 404. It is important to note that pinned layer 402 and pinned layer 404 have the same direction of magnetization. This orientation thus can effectively cancel out at least a portion of the effects of Neel coupling for either state, e.g., "1" or "0," that the free layer might be in.

In an exemplary embodiment, to have the directions of magnetization of pinned layer 402 and pinned layer 404 be the same, anti-ferromagnetic layers 202 and 226, used to pin pinned layers 402 and 404, respectively, are the same, e.g., have the same composition. Also, having the directions of magnetization of pinned layer 402 and pinned layer 404 be the same makes setting the magnetization of anti-ferromagnetic layers 202 and 226 easy using conventional annealing processes.

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A semiconductor device, comprising:
   at least one free layer;
   at least one fixed layer comprising at least one magnetic layer pinned to at least one anti-ferromagnetic layer;
   at least one barrier layer between the at least one free layer and the at least one fixed layer; and
   at least one pinned magnetic layer separated from the at least one free layer by at least one non-magnetic layer, the at least one pinned magnetic layer and non-magnetic layer being configured to cancel out at least a portion of a Neel coupling between the at least one free layer and the at least one fixed layer.

2. The device of claim 1, wherein the at least one free layer comprises an alloy selected from the group consisting of NiFe alloys, CoFeB alloys and combinations comprising at least one of the foregoing alloys.

3. The device of claim 1, wherein the at least one pinned magnetic layer comprises at least one magnetic layer pinned to at least one anti-ferromagnetic layer.

4. The device of claim 3, wherein the at least one magnetic layer comprises two or more magnetic layers anti-parallel coupled to each other by at least one spacer layer.

5. The device of claim 3, wherein the at least one anti-ferromagnetic layer comprises a metal alloy selected from the group consisting of PtMn, IrMn and combinations comprising at least one of the foregoing alloys.

6. The device of claim 3, wherein the at least one magnetic layer comprises two or more magnetic layers anti-parallel coupled to each other by at least one non-magnetic spacer layer.

7. The device of claim 3, wherein the at least one magnetic layer comprises two or more magnetic layers anti-parallel coupled to each other by at least one spacer layer, the at least one spacer layer comprising Ru.

8. The device of claim 1, wherein the at least one pinned magnetic layer comprises at least one ferromagnetic layer pinned to at least one anti-ferromagnetic layer.

9. The device of claim 3, wherein the at least one magnetic layer comprises CoFe.

10. The device of claim 1, wherein the at least one non-magnetic layer comprises a material selected from the group consisting of Ta, TaN and combinations comprising at least one of the foregoing materials.

11. The device of claim 1, wherein the at least one barrier layer comprises a material selected from the group consisting of aluminum oxides, tantalum oxides, magnesium oxides and combinations comprising at least one of the foregoing materials.

12. The device of claim 1, wherein the at least one free layer comprises two or more magnetic layers anti-parallel coupled to each other by at least one spacer layer.

13. The device of claim 1, wherein the at least one fixed layer comprises two or more magnetic layers anti-parallel coupled to each other by at least one spacer layer.

14. The device of claim 1, wherein a thickness of the at least one non-magnetic layer is configured to cancel out at least a portion of the Neel coupling between the at least one free layer and the at least one fixed layer.

15. The device of claim 1, wherein the at least one non-magnetic layer is configured to have a thickness relative to a thickness of the at least one barrier layer such that at least a portion of the Neel coupling between the at least one free layer and the at least one fixed layer is canceled out.

16. The device of claim 1, wherein the at least one non-magnetic layer is configured to have a thickness that is substantially similar to a thickness of the at least one barrier layer such that at least a portion of the Neel coupling between the at least one free layer and the at least one fixed layer is canceled out.

17. An integrated circuit including at least one magnetic memory cell, the at least one magnetic memory cell comprising:
   at least one free layer;
   at least one fixed layer comprising at least one magnetic layer pinned to at least one anti-ferromagnetic layer;
   at least one barrier layer between the at least one free layer and the at least one fixed layer; and
   at least one pinned magnetic layer separated from the at least one free layer by at least one non-magnetic layer, the at least one pinned magnetic layer and non-magnetic layer being configured to cancel out at least a portion of a Neel coupling between the at least one free layer and the at least one fixed layer.

18. A magnetic random access memory device, comprising:
   a plurality of magnetic memory cells configured in an array, at least one of the plurality of magnetic memory cells comprising:
   at least one free layer;
   at least one fixed layer comprising at least one magnetic layer pinned to at least one anti-ferromagnetic layer;
   at least one barrier layer between the at least one free layer and the at least one fixed layer; and
   at least one pinned magnetic layer separated from the at least one free layer by at least one non-magnetic layer, the at least one pinned magnetic layer and non-magnetic layer being configured to cancel out at least a portion of a Neel coupling between the at least one free layer and the at least one fixed layer.

19. A semiconductor device, comprising:
   at least one free layer comprising two or more magnetic layers anti-parallel coupled to each other by at least one spacer layer;
   at least one fixed layer comprising at least one magnetic layer pinned to at least one anti-ferromagnetic layer;
   at least one barrier layer between the at least one free layer and the at least one fixed layer; and
   at least one pinned magnetic layer separated from the at least one free layer by at least one non-magnetic layer, the at least one pinned magnetic layer comprising at least one magnetic layer pinned to at least one anti-ferromagnetic layer, the at least one pinned magnetic layer and non-magnetic layer being configured to cancel out at least a portion of a Neel coupling between the at least one free layer and the at least one fixed layer.

20. The device of claim 19, wherein the at least one fixed layer comprises two or more magnetic layers anti-parallel coupled to each other by at least one spacer layer.

21. The device of claim 19, wherein the at least one pinned magnetic layer comprises two or more magnetic layers anti-parallel coupled to each other by at least one spacer layer.

* * * * *